United States Patent

[11] 3,607,480

[72] Inventors Victor Harrap
Dallas;
Harold Gary Carlson, Richardson, both of Tex.
[21] Appl. No. 787,738
[22] Filed Dec. 30, 1968
[45] Patented Sept. 21, 1971
[73] Assignee Texas Instruments Incorporated
Dallas, Tex.

[54] PROCESS FOR ETCHING COMPOSITE LAYERED STRUCTURES INCLUDING A LAYER OF FLUORIDE-ETCHABLE SILICON NITRIDE AND A LAYER OF SILICON DIOXIDE
17 Claims, 10 Drawing Figs.

[52] U.S. Cl. .......... 156/17, 96/36.2, 117/212, 156/11, 252/79.3
[51] Int. Cl. .......... H01l 7/00
[50] Field of Search .......... 156/11, 17; 148/33.4, 33.5; 252/79.3; 117/212; 96/36.2

[56] References Cited
UNITED STATES PATENTS

| | | | |
|---|---|---|---|
| 2,966,432 | 12/1960 | Buck | 252/79.3 X |
| 3,122,817 | 3/1964 | Andrus | 156/17 X |
| 3,158,517 | 11/1964 | Schwarzenberger | 156/17 |
| 3,388,000 | 6/1968 | Waters et al. | 156/11 X |
| 3,409,979 | 11/1968 | Swamy et al. | 156/17 X |
| 3,472,689 | 10/1969 | Scott | 156/17 X |
| 3,479,237 | 11/1969 | Bergh et al. | 156/17 X |

*Primary Examiner*—John T. Goolkasian
*Assistant Examiner*—Joseph C. Gil
*Attorneys*—Samuel M. Mims, Jr., James O. Dixon, Andrew M. Hassell, Melvin Sharp, Henry T. Olsen, Michael A. Sileo and John E. Vandigriff

ABSTRACT: A single etchant process for etching a composite layered structure of silicon nitride and silicon dioxide. Hydrogen and fluoride ion-containing aqueous etching solutions, such as hydrofluoric acid having a concentration of less than approximately 2 percent by weight, and other equivalent solutions including ammonium fluoride and ammonium bifluoride solutions and fluosilicic acid, are applied to the structure while the temperature is maintained below the boiling point of these solutions, whereby the rate of etching of the silicon nitride is substantially equal to the rate of etching of the silicon dioxide.

Victor Harrap,
Harold Gary Carlson,
Inventors.

PROCESS FOR ETCHING COMPOSITE LAYERED STRUCTURES INCLUDING A LAYER OF FLUORIDE-ETCHABLE SILICON NITRIDE AND A LAYER OF SILICON DIOXIDE

This invention relates to an etching process and more particularly to a process for etching composite layered structures of silicon nitride and silicon dioxide.

In the fabrication of solid-state devices and particularly in planar device technology it is frequently necessary or desirable to etch through a composite layered or sandwich structure including a layer of silicon nitride and a layer of silicon dioxide. The conventional procedures use hot phosphoric acid to selectively attack and etch the silicon nitride layer and then a conventional buffered hydrofluoric acid etch is used to selectively attack and etch the silicon dioxide layer. A typical process sequence utilizes as a starting material a silicon substrate on which is formed a first film or layer of silicon dioxide, then a coating of silicon nitride is formed thereover and finally a surface layer of silicon dioxide is formed over the silicon nitride film. Following conventional photolithographic procedures a patterned etch mask is formed and a corresponding pattern is etched through the top silicon dioxide layer by buffered hydrofluoric acid etching. After removal of the original mask, and using the remaining top silicon dioxide layer as an etch mask, hot phosphoric acid (180° C.) is used to etch a corresponding pattern in the silicon nitride layer. This hot acid attacks the nitride at a rate about 10 times faster than it attacks the oxide. Then using the pattern in the silicon nitride layer as an etch mask a final etching step is carried out using buffered hydrofluoric acid to selectively attack and etch the underlying or bottom silicon dioxide layer.

Such a procedure is quite difficult to control since it is essential to know when each of the dielectric layers is etched through. Under-etching to any extent cannot be tolerated, whereas over-etching tends to reduce the quality of pattern definition. Such close process tolerances demand accurate control of the dielectrics in the three-layered structure in regard to thickness and etch rate, and also the activity of etch used, where composition and temperature need to be carefully controlled. In such a three-step etch procedure the bottom oxide is undercut during the final etching operation. This results in the silicon nitride layer overhanging the edge of the underlying silicon dioxide layer which complicates metallization and encourages entrapment of impurities. Such a three-step etch method is a relatively slow and complex procedure requiring a total of three sets of operations plus inherent etch time. The hot phosphoric acid is maintained in a reflex system which is inconvenient to use and is relatively hazardous.

Among the several objects of the invention may be noted the provision of a single one-step etching process in which silicon nitride and silicon dioxide are attacked and etched at comparable rates and which is simple and convenient to carry out; the provision of such processes where extremely accurate thickness control and over-etching are not required; the provision of processes in which undercutting of a layer of silicon dioxide and a resulting overhanging of an overlying film or layer of silicon nitride is avoided; and the provision of a process for etching a composite layered structure including a layer of silicon nitride and a layer of silicon dioxide which is safe, simple, convenient and in which open beaker etching procedures may be used. Other objects and features will be in part apparent and in part pointed out hereinafter.

Briefly, the process of the present invention for etching composite layered structures including a layer of silicon nitride and a layer of silicon dioxide comprises applying to the composite layered structure an aqueous etching solution containing hydrogen and fluoride ions and having a fluoride ion concentration equivalent to that of an aqueous solution of hydrogen fluoride with a concentration of less than approximately 2 percent by weight while maintaining the temperature below the boiling point of the solution.

The invention accordingly comprises the methods hereinafter described, the scope of the invention being indicated in the following claims.

In the accompanying drawings, in which one of various possible embodiments of the invention is illustrated, FIGS. 1–6 are schematic cross sections illustrating successive steps in the fabrication of a solid-state device or integrated circuit in which a composite layered structure of silicon nitride and silicon dioxide is formed and subsequently etched by a single etchant process of the present invention;

Corresponding reference characters indicated corresponding parts throughout the several views of the drawings.

Figures 1, 2, 3, 4, 5, 6:
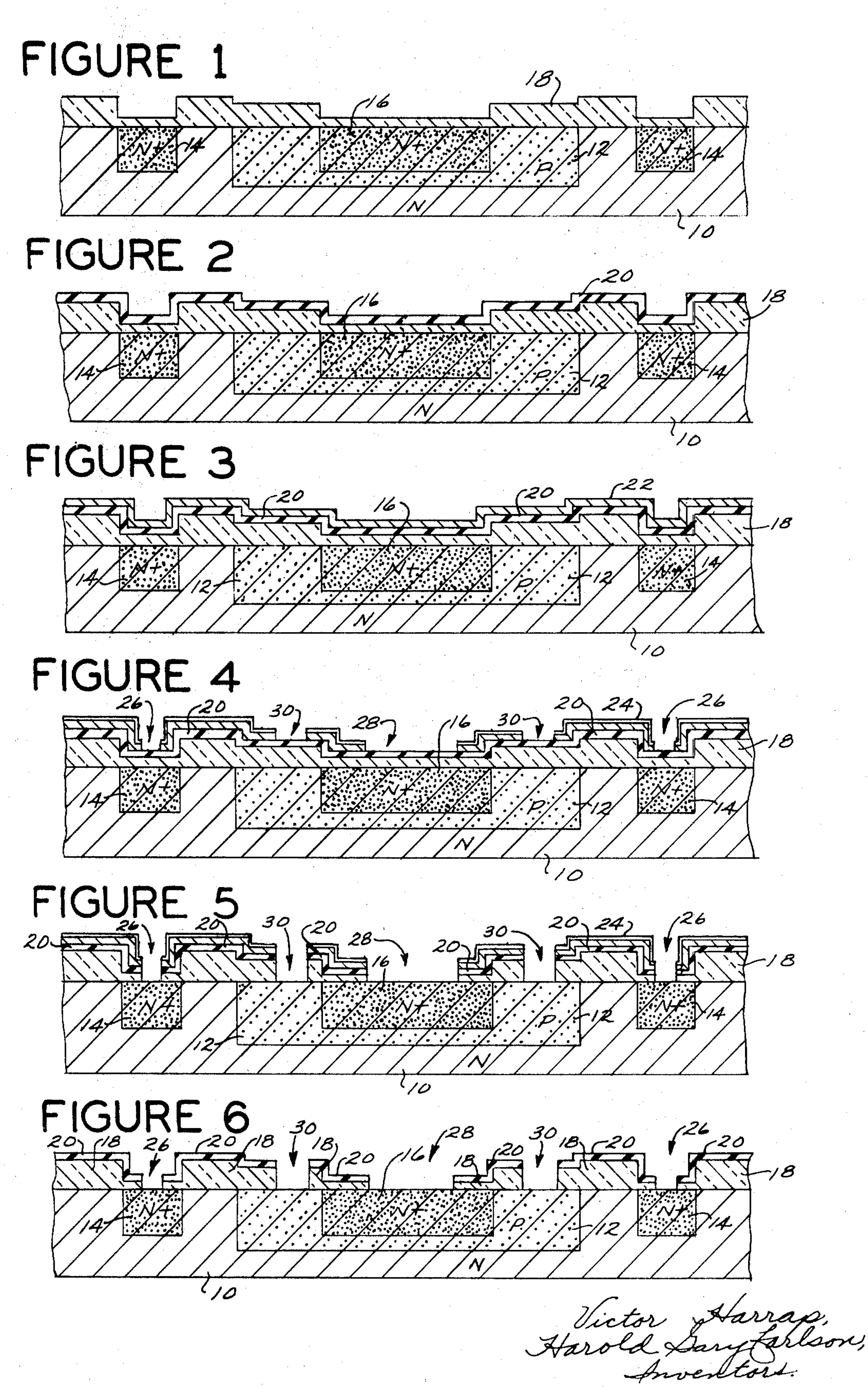
FIGS. 5A and 6A are enlarged fragmentary detailed views of portions of FIGS. 5 and 6.

Referring now to the drawings, a substrate of N-type silicon is indicated at reference numeral 10. An exemplary substrate is a slice of single crystal silicon lightly doped with a suitable N-type dopant such as phosphorus. It will be understood that any customary silicon substrate used in fabricating devices or integrated circuits, such as a P-type silicon slice, could constitute substrate 10. By prior conventional procedures, a P-type diffused base region 12, a relatively heavily N-doped guard or isolation ring 14, and a relatively heavily doped N-type emitter region 16 have been formed in substrate 10. During these diffusion steps a multilevel layer 18 of silicon dioxide was sequentially grown. That is, in each of the preceding diffusions a thickness of silicon dioxide was grown and, after patterning by conventional photolithographic techniques and subsequent etching, was used as a mask for a subsequent diffusion.

A layer or film 20 of silicon nitride is formed (FIG. 2) on the upper surface of silicon dioxide layer 18 using any of the conventional deposition techniques known to those skilled in this field, such as vapor phase reaction of silane and ammonia in nitrogen in a tube or barrel-type reactor, or by sputtering procedures. FIG. 3 illustrates the FIG. 2 structure after deposition of a film or coating 22 which will resist etching by hydrofluoric acid and serves as an etch mask therefor. Metallic materials, such as the metals molybdenum, tungsten, platinum or the alloy nichrome, applied to the silicon nitride layer 20 in a conventional manner such as by RF sputtering, are useful coatings for this purpose. A layer 24 of any conventional photosensitive resist, such as KMER, is then applied to the surface of layer 22, and in accordance with conventional photolithographic patterning procedures, a mask with windows or apertures 26, 28 and 30 is formed. Using an appropriate etching material for masking layer 22 (such as a ferricyanide solution for molybdenum, e.g., as described by Brown et al., J. Electrochem. Soc., p. 730, 1967), portions of layer 22 are removed to form matching apertures or windows in this layer (FIG. 4).

Figures 5A, 6A, 7:
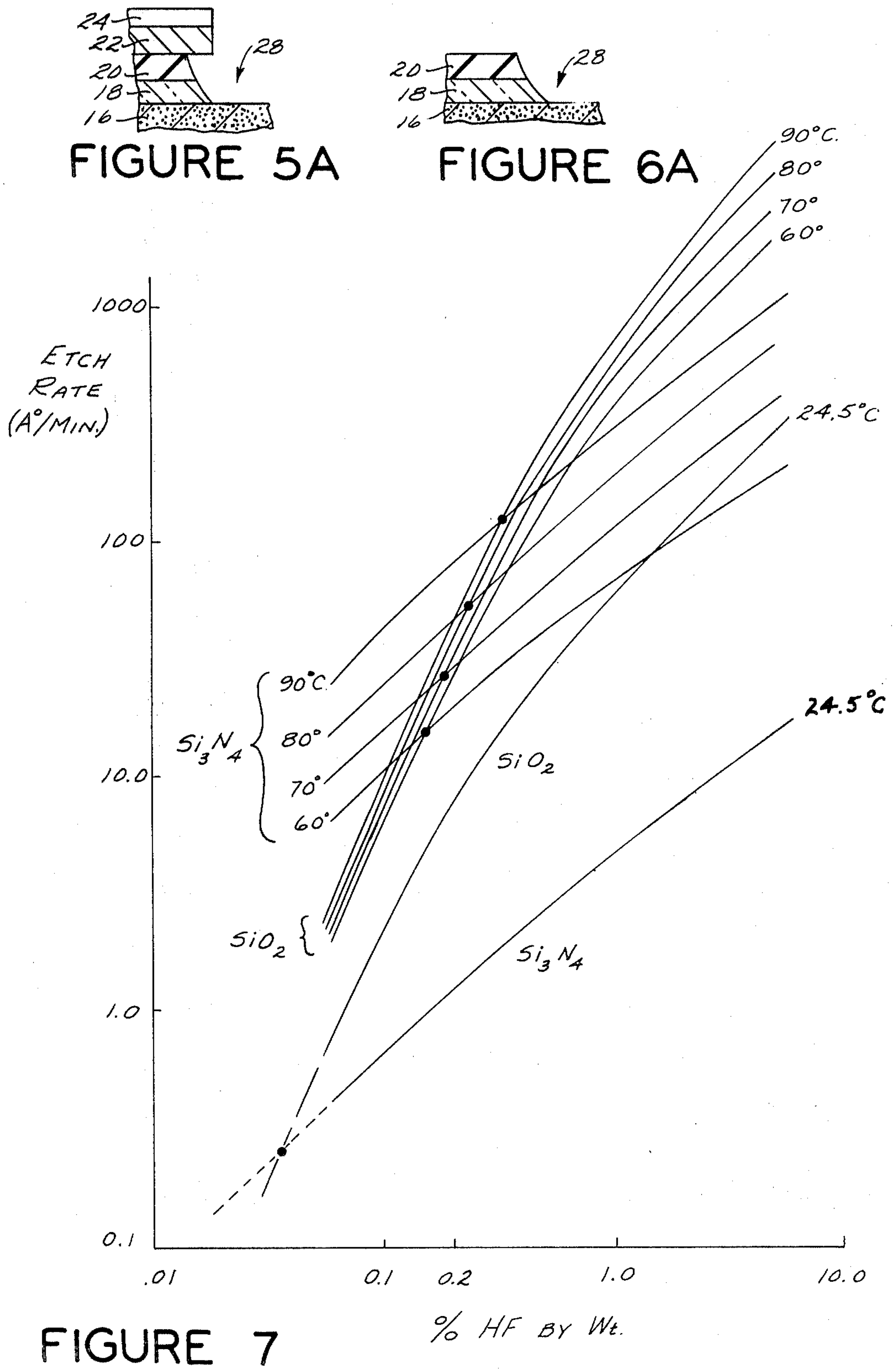
FIG. 7 is graphical representation of the relationship between the etch rates of silicon nitride and silicon dioxide in different concentrations of hydrofluoric acid in water at different temperatures.

Utilizing this patterned layer or mask, the portions of the composite layered structure of silicon nitride 20 and silicon dioxide 18 which underlie these windows are then subjected to etching in accordance with this invention. The upper surface of the FIG. 4 structure is etched with hydrofluoric acid having a concentration of 0.3 percent by weight and the temperature is maintained at 90° C. ±1° C. Silicon nitride layer 20 and then silicon dioxide layer 18 are attacked or etched at substantially equal rates to form the structure of FIG. 5 wherein the upper surfaces of the desired portions of regions 12, 14 and 16 are exposed. The ratio of the etching rate of the oxide to the etching rate of the nitride is 1.0 ±0.1. Excellent etch rate reproducibility is also obtained under these conditions, viz, 100 ±10A./minute. It is preferred to add deionized water to the etching solution where the etching time is relatively long to replace water lost by evaporation. Following this etching the photosensitive resist mask layer 24 is stripped and the remaining mask layer 22 is also stripped, leaving the the structure of FIG. 6 prepared for completion of the device or integrated circuit by conventional metallizing and masking to form contacts and interconnecting leads, etc. Certain of the advantageous results of this single etchant procedure are illustrated in FIGS. 5A and 6A which represent actual electron scanning micrographs of the windows defined in device structures wherein there is no shelving of the silicon nitride layer. In conventional multiple etching procedures the silicon nitride layer has a marked tendency to be undercut and overhang the silicon dioxide layer in much the same manner as the metal layer overhangs the silicon nitride layer in FIG. 5A and which layer is subsequently stripped off as shown in FIG. 6A.

Figure 8:
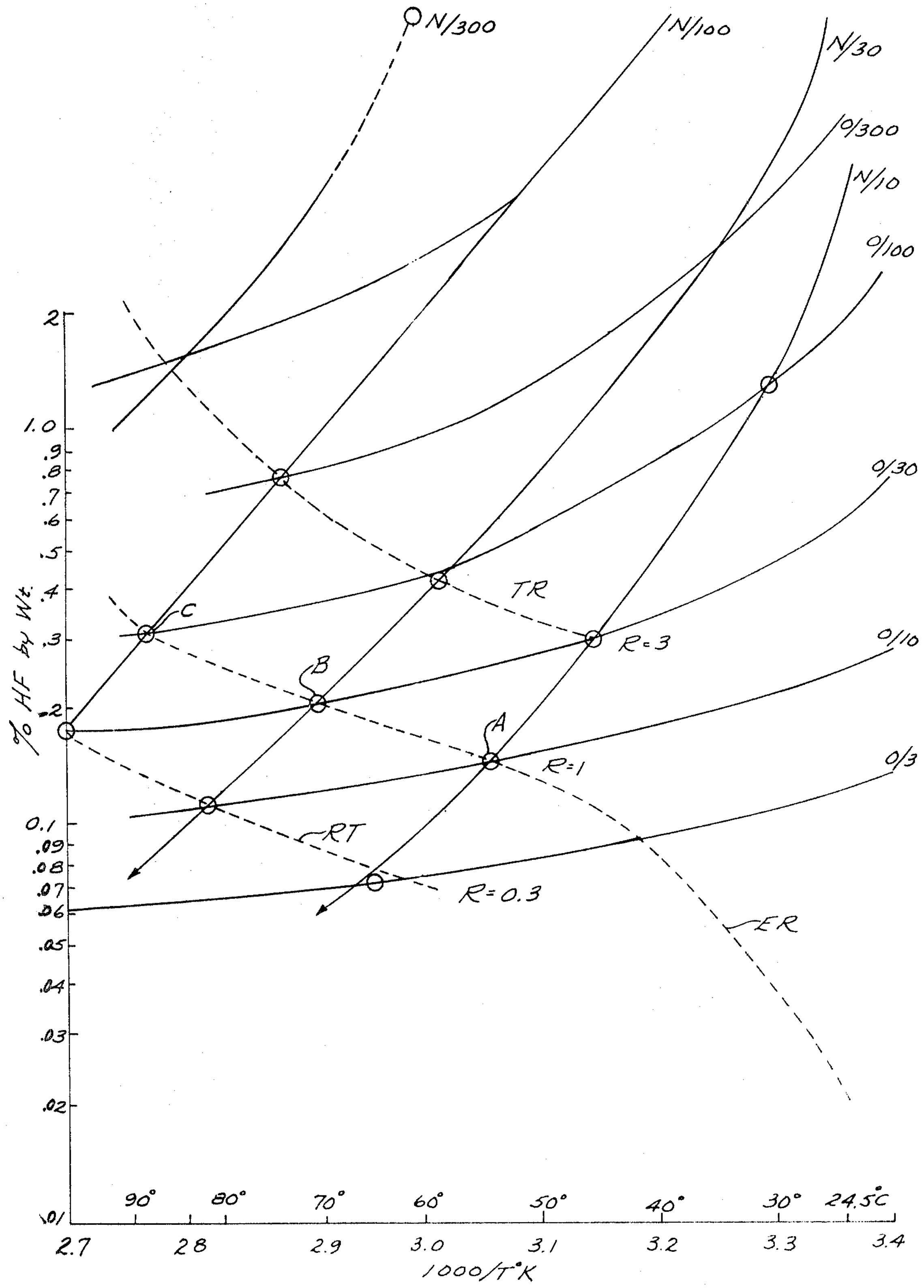
FIG. 8 is a graph illustrating the ratios of the rates of etching silicon dioxide and silicon nitride at different hydrofluoric acid concentrations and temperatures.

The concentration or dilution of hydrofluoric acid and the etching temperatures may be varied considerably from the values given above and this will alter the absolute etch rates of the oxide and nitride as well as affecting the ratio of etch rates. This is illustrated in FIG. 7 in which the effect of concentration or dilution of the hydrofluoric acid on the etching rates (A./min.) of silicon nitride ($Si_3N_4$) and silicon dioxide ($SiO_2$) at different temperatures is shown. The respective points of intersection of these two sets of curves represent the concentrations of hydrofluoric acid which etch the nitride and the oxide at equal rates at respective temperatures, the scales of the abscissa and ordinate of this graph both being logarithmic. FIG. 8 graphically depicts lines of fixed or constant etch rate ratios, where $R=r_o/r_N$; $r_o$ being the rate of etching silicon dioxide and $r_N$ being the rate of etching silicon nitride. In this instance the ordinate representing hydrofluoric acid concentration is scaled logarithmically while the abscissa, representing the reciprocal of the absolute temperature of etching, is not. These lines of fixed etch rate ratios are determined by respective points of intersection of different oxide and nitride etch rates. For example, intersection A of the line 0/10 (i.e., a line determined by the temperatures and the concentrations which will cause oxide etching at the rate of 10 A./min.) with the line N/10 (i.e., a line determined by the temperatures and concentrations which will cause nitride etching at the rate of 10 A./min.) represents a point of equal etching rates. Point A, and points B and C similarly determined by the respective intersections of the N/30–0/30 curves and the N/100–0/100 curves, establish a line ER of equal etching rates. In a similar fashion lines TR and RT are established, the former depicting the respective concentrations and temperatures at which the oxide etches three times faster than the nitride, while the latter represents the temperatures and concentrations at which the oxide etches at a rate only 0.3 that of the nitride.

It is, of course, preferred that the process be carried out at concentrations and temperatures at which the etching rates of the oxide and nitride are substantially equal. However, in some circumstances some variations in the ratio from $R$=1 are permissible and may even be desirable. Although the reaction temperatures as low as typical room temperatures (e.g., 24.5° C.) and concentrations as low as 0.035 percent will provide equal etch rates (e.g., less than 1 A./min.), such rates of etching are lower than would normally be desired. Thus it is preferred that temperatures of at least about 60° C. and concentrations of at least about 0.07 percent be utilized. Temperatures higher than 90° C. and concentrations higher than 0.3 percent by weight (about 0.5 percent by dilution or volume) will also provide substantially equal etching rates of nitride and oxide. At about 90° C. or less and in the low concentration ranges involved herein, the loss from the solution is primarily water evaporation. Higher temperatures up to the boiling point of this solution may be used but with some increased loss of hydrogen fluoride. The boiling point at ambient pressures, such as in an open beaker, which is conveniently used for this process, is in the order of about 96° C. At these higher temperatures, higher concentrations such as 0.7 percent or higher will be maintained to attain substantially equal rates of nitride and oxide etching.

It is also to be noted that the characteristics of silicon nitride layers can vary considerably depending on the processes used in forming these layers or films. For example, the ratios of ammonia to silane can be varied considerably and advantageously as described in copending, coassigned U.S. Pat. application Ser. No. 649,299, filed June 27, 1967 now U.S. Pat. No. 3,549,411, and at temperatures below 900° C., this will form amorphorus silicon nitride coatings which have different rates of etching. In the above example the silicon nitride layer 20 was formed in a tube furnace at about 850° C. with flow rates of 0.3 liter/min. of ammonia, 0.8 liter/min. of silane and 80 liters/min. of nitrogen. By increasing the ammonia flow rate from 0.3 to 1 liter/min. a nitride is formed which etches somewhat more rapidly, and this will change the equal etching rates from about 102 to about 117 A./min. and the concentration from about 0.33 percent to about 0.5 percent the temperature remaining 90° C. Even the type reactor, such as tube or barrel, can effect some difference in the etching characteristics of the nitride layer. In generally the same fashion the nature and etching characteristics of the silicon dioxide may be affected by the particular process of forming this dielectric material. For example, the oxide may be formed by dry or wet (steam) processes, etc., and the etch rates can vary dependent on the particular process conditions utilized. The silicon dioxide exemplarily used herein was thermally grown using the wet or steam process. Accordingly, comparable variations in the temperatures and concentrations of etching may be conveniently made to attain substantially constant rates of etching of composite layered structures of such silicon nitrides and silicon dioxides having somewhat different etching characteristics.

Another single etchant solution was made by dissolving 4.29 grams of ammonium bifluoride in 1.000 ml. of water which provides a fluoride concentration substantially the same as that of 0.3 percent by weight hydrofluoric acid. Silicon nitride and silicon dioxide layers of approximately 1,000 A., in thickness were exposed to this aqueous etching solution maintained at 90° C. The rates of etching of these nitride and oxide films was approximately equal at about 150 A./min. Similarly, another aqueous etching solution was prepared by dissolving 5.55 grams of ammonium fluoride in 1,000 ml. of water and at 90° C. silicon nitride and oxide layers were each etched at substantially the same rate of about 6 A./min.

It is to be understood, therefore, that the etching solutions utilized in the processes of this invention may be aqueous solutions of hydrogen fluoride, ammonium fluoride, ammonium bifluoride, or fluosilicic acid, or aqueous solutions of other compounds which will provide concentrations of hydrogen and fluoride ions within the concentration range stated above. That is, the single etchant solutions utilized in this invention include aqueous etching solutions containing hydrogen and fluoride ions which have a fluoride ion concentration equivalent to the fluoride ion concentration of an aqueous solution of hydrogen fluoride with a concentration less than approximately 2 percent by weight. Although scientific validation of the etch mechanisms involved herein is difficult, it is believed likely that the above etchants attack the silicon nitride first by water hydrolysis to form some form of silica which is then attacked by the hydrogen and fluoride ions of the etching solution.

Also, it will be noted that materials other than molybdenum platinum, tungsten or nichrome may be employed in forming the mask layer 22.

In view of the above, it will be seen that the several objects of the invention are achieved and other advantageous results attained.

As various changes could be made in the above methods without departing from the gist of the invention, it is intended that all matter contained in the above description or shown in the accompanying drawings shall be interpreted as illustrative.

What is claimed is:

1. A process for etching composite layered structures including a layer of fluoride-etchable silicon nitride and a layer of silicon dioxide comprising applying to said composite layered structure an aqueous etching solution containing hydrogen and fluoride ions and having a fluoride ion concentration equivalent to that of an aqueous solution of hydrogen fluoride with a concentration less than approximately 2 percent by weight while maintaining the temperature below the boiling point of the solution, for a time sufficient to achieve etching of both layers, whereby both layers are etched at substantially the same rate.

2. A process as set forth in claim 1 wherein said solution comprises hydrofluoric acid.

3. A process as set forth in claim 1 wherein said solution comprises a solution of ammonium bifluoride.

4. A process as set forth in claim 1 wherein said solution comprises a solution of ammonium fluoride.

5. A process as set forth in claim 1 wherein said solution comprises fluosilicic acid.

6. A process as set forth in claim 1 wherein said concentration is between approximately 0.07 percent and 0.7 percent by weight and the temperature is maintained between approximately 60° C. and 96° C. whereby the rates of etching the silicon nitride and the silicon dioxide are substantially equal.

7. A process as set forth in claim 6 wherein said concentration is approximately 0.3 percent and the temperature is maintained at approximately 90° C.

8. A process as set forth in claim 6 wherein said concentration is maintained at a substantially constant level by adding water to replace that lost by evaporation.

9. A process for producing apertures in composite layered structures including a layer of amorphous silicon nitride and a layer of silicon dioxide on a silicon substrate comprising forming a mask over the surface of the structure, and applying thereto an aqueous etching solution containing hydrogen and fluoride ions and having a fluoride ion concentration equivalent to that of an aqueous solution of hydrogen fluoride with a concentration of less than approximately 2 percent by weight while maintaining the temperature below the boiling point of the solution, said mask being resistant to etching by the solution, for a time sufficient to achieve etching of both layers, whereby both layers are etched at substantially the same rate.

10. A process as set forth in claim 9 wherein said solution comprises hydrofluoric acid.

11. A process as set forth in claim 9 wherein said solution comprises a solution of ammonium bifluoride.

12. A process as set forth in claim 9 wherein said solution comprises a solution of ammonium fluoride.

13. A process as set forth in claim 9 wherein said solution comprises fluosilicic acid.

14. A process as set forth in claim 9 wherein said between about 0.07 percent and 0.7 percent and the temperature between about 60° C. and 96° C.

15. A process as set forth in claim 9 wherein said mask is formed of a metallic material which is etchable by a material which will not significantly attack silicon nitride and silicon dioxide.

16. A process as set forth in claim 15 wherein said mask if formed of a metallic material selected from the group consisting of molybdenum, platinum, tungsten and nichrome, and wherein said temperature is approximately 90° C. and the acid concentration is approximately 0.3 percent.

17. A process as set forth in claim 16 wherein said acid concentration is maintained at approximately 0.3 percent by adding water to replace that lost by evaporation.